United States Patent [19]

Nix

[11] Patent Number: 5,272,654
[45] Date of Patent: Dec. 21, 1993

[54] SYSTEM FOR CONVERTING A FLOATING POINT SIGNED MAGNITUDE BINARY NUMBER TO A TWO'S COMPLEMENT BINARY NUMBER

[75] Inventor: Michael A. Nix, Buda, Tex.

[73] Assignee: Advanced Micro Devices, Inc., Sunnyvale, Calif.

[21] Appl. No.: 766,814

[22] Filed: Sep. 26, 1991

[51] Int. Cl.[5] .......................... G06F 7/00; G06F 7/38
[52] U.S. Cl. ............................... 364/715.03; 364/748
[58] Field of Search ........................... 364/715.03, 748; 341/50

[56] References Cited

U.S. PATENT DOCUMENTS 4,805,128 2/1989 Nelsen et al. ............... 364/715.03

Primary Examiner—Tan V. Mai
Attorney, Agent, or Firm—Foley & Lardner

[57] ABSTRACT

A system for converting a floating point n-bit signed magnitude binary number to a fixed point two's complement binary number having m bits wherein m is greater than n, first converts the n bit signed magnitude binary number to a corresponding n-bit two's complement binary number. Thereafter, a shifter shifts the n-bit two's complement binary number to the left or right and by a number of bits responsive to received shift decode signals for providing the final fixed point m-bit two's complement binary number.

12 Claims, 3 Drawing Sheets

SYSTEM FOR CONVERTING A FLOATING POINT SIGNED MAGNITUDE BINARY NUMBER TO A TWO'S COMPLEMENT BINARY NUMBER

BACKGROUND OF THE INVENTION

The present invention is generally directed to an improved system for converting a floating point n-bit signed magnitude binary number to a fixed point two's complement m-bit binary number wherein m is greater than n. The system of the present invention has particular utility in a multiplier system which multiplies two signed magnitude operands together.

Systems for multiplying two signed magnitude operands together to provide an n-bit signed magnitude binary number are well known in the art. Such systems multiply the operand magnitudes and add the operand exponents. Often, it is desired to format the multiplication product in fixed point two's complement m-bit form wherein m is greater than n to account for the exponent.

In the prior art, the conversion of a signed magnitude binary number to a two's complement binary number for such an application required two steps. First, the signed magnitude product is scaled in a left-right shifter wherein the n-bit product is shifted to the left or the right and by a number of bits depending upon the exponent of the multiplication product to provide a corresponding fixed point signed magnitude m-bit binary number. Then, the m-bit signed magnitude binary number is converted to a corresponding m-bit two's complement binary number.

The foregoing conversion technique requires considerable hardware and time to achieve the required conversion. The conversion to two's complement generally requires a chain of half adder cells with a half adder cell being provided for each signed magnitude bit. As a result, if the signed magnitude m-bit binary number contains fifteen bits, for example, fifteen half adder cells are required to effect the conversion. Furthermore, in such a case, the delay time in the two's complement converter is represented by the chain of fifteen half adder cells.

The present invention provides an alternative approach for converting a floating point n-bit signed magnitude binary number to a fixed point m-bit two's complement binary number which requires less time and hardware to achieve the conversion. For example, if the magnitude of the signed magnitude binary number contains eight bits and the final fixed point two's complement binary number contains fifteen bits, seven less half adder cells are required as compared to the prior art method. This not only represents less hardware, but also represents less conversion delay time because of the reduced number of required half adder cells.

SUMMARY OF THE INVENTION

The present invention provides a system for converting a floating point n-bit signed magnitude binary number to a fixed point two's complement binary number having m-bits, wherein m is greater than n. The system includes converting means for converting the n-bit signed magnitude binary number to a corresponding n-bit two's complement binary number. The converting means includes an input for receiving the n-bit signed magnitude binary number and an output for providing the corresponding n-bit two's complement binary number. The system also includes shift means including an input for receiving the n-bit two's complement binary number and an output for providing the fixed point m-bit two's complement binary number. The shift means shifts the n-bit two's complement binary number to the left or right responsive to receive shift decode signals.

The present invention further provides a system for converting a floating point n-bit signed magnitude binary number to a fixed point two's complement binary number having m-bits, wherein m is greater than n, for use in a floating point multiply system including a multiplier for multiplying first and second operand magnitudes to provide the n-bit signed magnitude binary number, a sign decoder for providing sign control signals responsive to the signs of the operands, and a shift decoder for providing shift decode signals including force carry signals responsive to the exponents of the operands. The system includes converting means for converting the signed magnitude n-bit binary number to a corresponding two's complement n-bit binary number. The converting means includes a plurality of half adder cells coupled in series relation in the order of the n-bits of the n-bit signed magnitude binary number with each including a carry output for providing the next higher ordered half adder cell with a carry signal. Each half adder cell further includes an input for receiving a respective different one of the n-bits of the signed magnitude n-bit binary number and a force carry input for receiving the force carry signals for providing the next higher ordered half adder cell with the carry signal responsive to receiving a force carry signal. Each half adder cell further includes an output for providing a respective given one of the bits of the corresponding n-bit two's complement binary number. The system further includes shift means coupled to the half adder cells outputs for receiving the corresponding n-bit two's complement binary number, an output for providing the n-bit fixed point two's complement binary number, and is responsive to the shift decode signals for shifting the corresponding n-bit two's complement binary number a selected number of bits for generating the n-bit fixed point two's complement binary number. The shift means is also responsive to the sign control signals for extending the sign in the higher ordered bits of the m-bit fixed point two's complement binary number.

BRIEF DESCRIPTION OF THE DRAWINGS

The features of the present invention which are believed to be novel are set forth with particularity in the appended claims. The invention, together with further objects and advantages thereof, may best be understood by making reference to the following description taken in conjunction with the accompanying drawings, in the several figures of which like reference numerals identify identical elements, and wherein:

DETAILED DESCRIPTION OF THE PREFERRED EMBODIMENT

Figure 1:
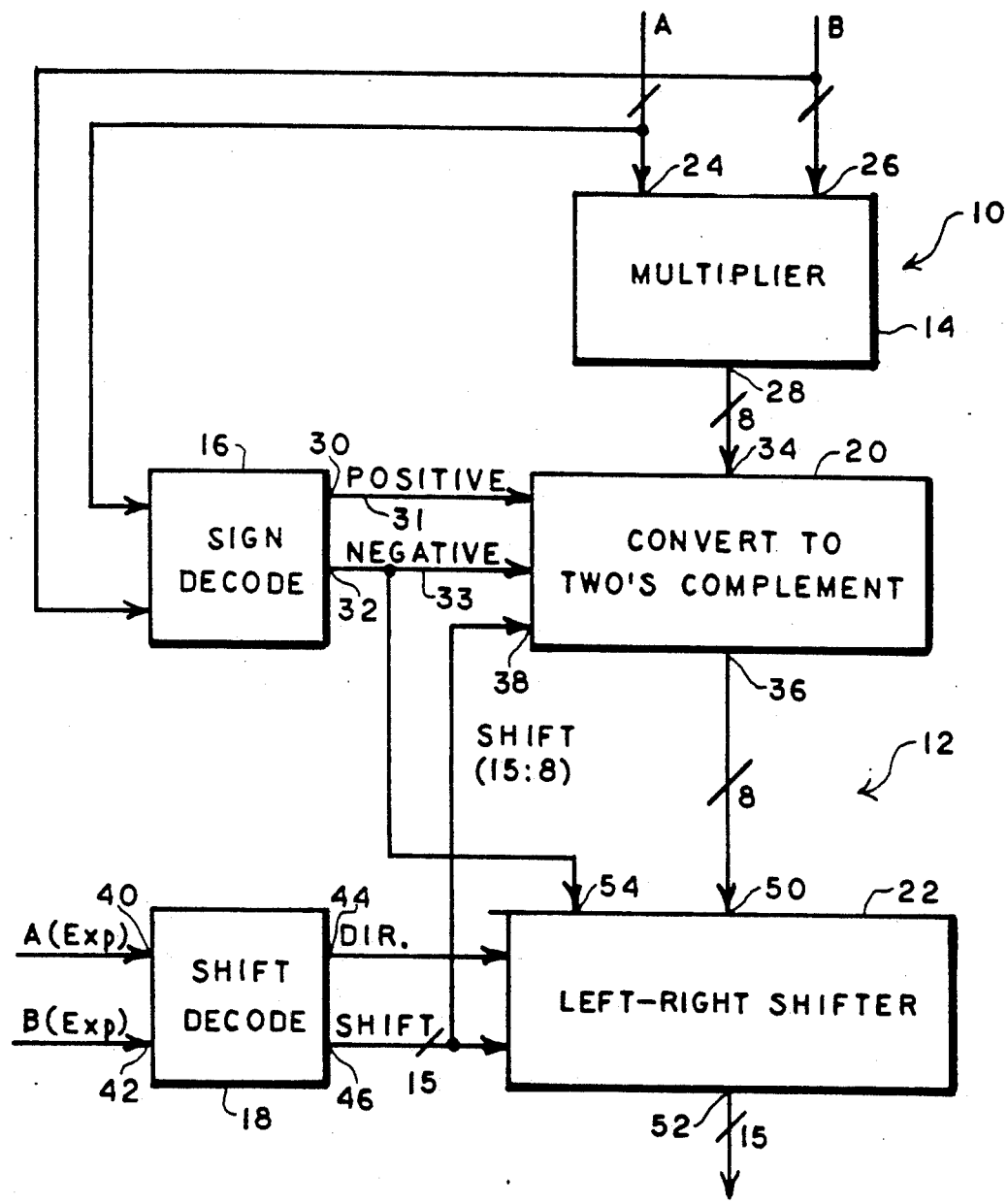
FIG. 1 is a block diagram illustrating a two's complement conversion system embodying the present invention for use in a multiplying system.

Referring now to FIG. 1, it illustrates, in block diagram form, a multiplying system 10 which includes a convert to two's complement system 12 embodying the present invention. The multiplying system 10 generally includes a multiplier 14, a sign decoder 16, a shift decoder 18, and the convert to two's compliment system 12. The convert to two's complement system 12 includes a converting means 20 for converting a signed magnitude n-bit number to a corresponding two's complement n-bit binary number and a left-right shifter 22 for shifting the n-bit two's complement binary number provided by the converting means 20 to the left or the right and by a number of bits determined by the shift decoder 18 for providing the resulting fixed point m-bit two's complement binary number. In accordance with this preferred embodiment, n is equal to 8, and m is equal to 15.

Multiplier 14 includes a first input 24 for receiving a first multiple-bit operand (operand A) and second input 26 for receiving a second multiple-bit operand (operand B). Each of the multiple-bit operands A and B is a signed magnitude multiple-bit binary number associated with an exponent and a sign bit. The multiplier 14 multiplies the operand magnitudes to provide an 8-bit magnitude binary number at its output 28. The sign bits of the operands A and B are provided to the sign decoder 16 which determines whether the multiplication product provided at output 28 is positive or negative. The sign decoder 16 performs an exclusive OR operation on the operand sign bits so that if both bits are negative or if both bits are positive the sign decoder provides an active logic level at an output 30 to indicate that the multiplication product is a positive number. If however, one sign bit is positive and the other sign bit is negative, the sign decoder will provide an active logic signal at its other output 32 to indicate that the multiplication product is a negative number.

The convert to two's complement 20 is coupled to the outputs 30 and 32 of the sign decoder 16 for receiving the sign decode signals from the sign decoder 16. If the multiplication product is positive and output 30 provides an active logic level, the convert to two's complement 20 will pass the 8-bit binary magnitude from its input 34 to its output 36 without conversion since a positive signed magnitude binary number has the same binary representation as its corresponding multiple-bit two's complement binary number. However, if the multiplication product is negative and output 32 provides an active logic level, the convert to two's complement 20 converts the multiple-bit binary magnitude received at its input 34 to a multiple-bit two's complement binary number.

As will be seen hereinafter, the convert to two's complement 20 includes a plurality of half adder cells which are coupled in series and with each cell including a carry output for providing its next higher ordered cell with a carry signal responsive to receiving a shift decode signal at an input 38 from the shift decoder 18. As previously mentioned, each of the operands A and B is associated with an exponent. Since the final resulting multiple-bit binary number is a fixed point multiple-bit number, it is necessary to shift the multiplication product to the left or the right by a number of bits dependent upon the sum of the operand exponents to locate the final result in relation to binary point. As a result, the shift decoder 18 receives the multiple-bit exponent for operand A at input 40 and the multiple-bit exponent for operand B at input 42. The shift decoder 18 thereafter adds the exponents together and determines from the sum of the exponents whether the 8-bit two's complement binary number provided at output 36 of converting means 20 is shifted to the left or the right and the number of bits that it is s shifted. To that end, the shift decoder 18 provides shift decode signals including a direction control signal at output 44 indicating the direction of the shift and shift control signals at output 46 which indicate the number of bits of the shift.

Preferably, the left-right shifter 22 is arranged such that when the 8-bit two's complement binary number provided by the converting means 20 is not shifted, the 8-bit two's complement binary number will occupy the upper 8-bits of the final fixed point 15-bit two's complement binary number. As a result, when there is no shift, the 8-bit two's complement binary number will occupy bits seven-fourteen with bit zero being the first bit.

In the event that the 8-bit two's complement binary number is to be shifted by more than m-n bits or, in accordance with this preferred embodiment, more than 7-bits to the right, the shift decode 18 provides from its output 46 one of a plurality of force carry signals to input 38 of the converting means 20. One such force carry signal for a given bit will be provided when the shift is greater than 7-bits. For example, if the right shift is 10 bits, a force carry signal corresponding to bit 10 will be provided. The force carry signals cause the half adder cells to force a carry to the next higher ordered half adder cell. Hence, when the shift to the right is to be 10 bits as in this example, the third half adder cell will receive a force carry input and will provide responsive thereto a carry output to the next higher ordered or fourth half adder cell. The force carry is provided so that the data bits which are shifted off to the right do not effect the conversion to the two's complement binary number. The force carry signals comprise a portion of the decode shift signals provided at output 46. For example, if the shift is 7 or less bits, there will be no force carry signal applied to the converting means 20 while the decode shift signals provided to the left-right shifter 22 will cause the left-right shifter 22 to shift the 8-bit two's complement binary number to the right by the appropriate number of bits.

The left to right shifter 22 includes an input 50 for receiving the 8-bit two's complement binary number. It provides at output 52 the final fixed point 15-bit two's complement binary number.

Since, in accordance with the present invention, the shifting occurs after the conversion to the two's complement binary number by converting means 20, the left-right shifter 22 is shifting signed data instead of magnitude data. As a result, the left-right shifter 22 includes a result sign input 54 which is coupled to output 32 of the sign decoder 16. When the final 15-bit two's complement binary number is negative, the left-right shifter 22 will receive the negative sign signal from output 32 of the sign decoder 16. This causes the left-right shifter 22 to extend the sign of the final 15-bit fixed point two's complement binary number in the upper bits. Such sign extension is well known in the art.

Figure 2:
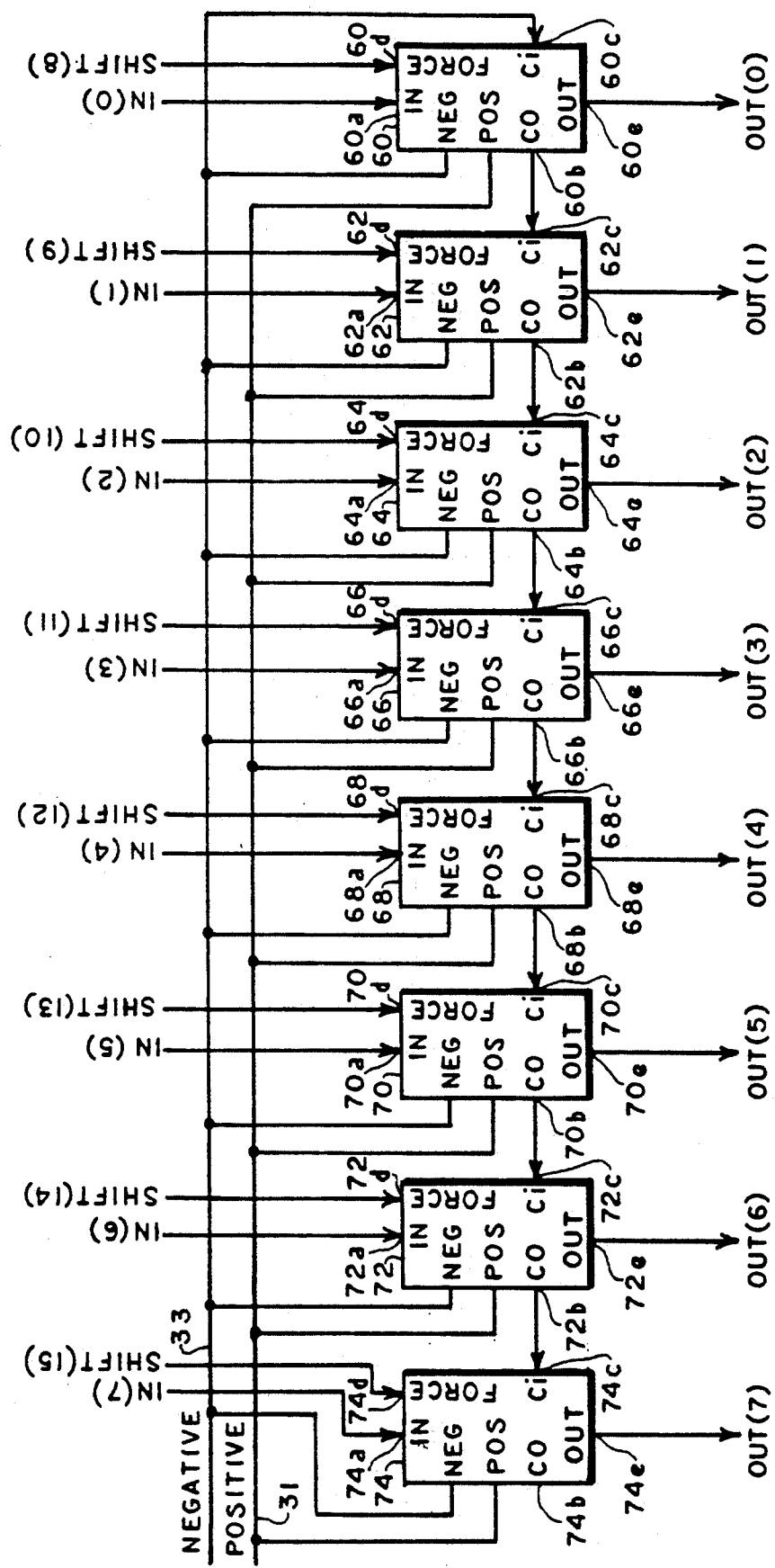
FIG. 2 is a detailed schematic diagram of the convert to two's complement illustrated in FIG. 1 which includes a plurality of half adder cells arranged in accordance with the present invention.

Referring now to FIG. 2, it illustrates, in circuit diagram form, the convert to two's complement 20 of FIG. 1. The convert to two's compliment 20 includes a plurality of half adder cells 60, 62, 64, 66, 68, 70, 72, and 74. It will be noted that there are as many half adder cells as there are bits in the signed magnitude binary number to be converted to two's complement. It will also be noted that since the conversion to two's complement, in accordance with the present invention, occurs before the scaling in the left-right shifter 22, only n number of half adder cells are required as compared to the prior art technique which requires a number of half adder cells equal to m. In accordance with this preferred embodiment, therefore, the convert to two's complement 20 includes seven less half adder cells then would be required in practicing the aforementioned prior art technique.

The half adder cells 60–74 are arranged in ascending order with each having an input 60a, 62a, 64a, 66a, 68a, 70a, 72a, and 74a for receiving a respective given one of the bits of the 8-bit sign magnitude binary number to be converted. In addition, each of the half adder cells 60–74 includes a positive input coupled to positive line 31 which is coupled to output 30 of sign decoder 16 and a negative input which is coupled to line 33 which is coupled to output 32 of sign decoder 16. As a result, the sign decode signals are applied to each of the half adder cells.

Each of the half adder cells also includes a carry output 60b, 62b, 64b, 66b, 68b, 70b, 72b, and 74b respectively. The carry output of each half adder cell provides a carry signal to the carry input of the next higher ordered half adder cell. To that end, the half adder cells also include carry inputs 60c, 62c, 64c, 66c, 68c, 70c, 72c, and 74c respectively. It will be noted in FIG. 2 that carry input 60c of half adder cell 60 is coupled to the negative control line 33. As a result of this configuration, the half adder cells 60–74 are coupled in series relation in ascending order and in accordance with the bit of the signed magnitude binary number received by the half adder cells.

Each of the half adder cells 60–74 also includes a force carry input 60d, 62d, 64d, 66d, 68d, 70d, 72d, and 74d. As illustrated in FIG. 2, each of the force carry inputs is arranged to receive a different shift decode signal from the shift decoder 18. For example, if the 8-bit two's complement binary number is to be shifted ten places to the right, half adder cell 64 will receive a force carry signal at its input 64d. This will cause half adder cell 64 to provide a carry signal at its output 64b which is provided to the next higher ordered cell 66 at its carry input 66c.

Lastly, each of the half adder cells includes an output 60e, 62e, 64e, 66e, 68e, 70e, 72e, and 74e respectively These outputs form the output 36 illustrated in FIG. 1.

Figure 3:
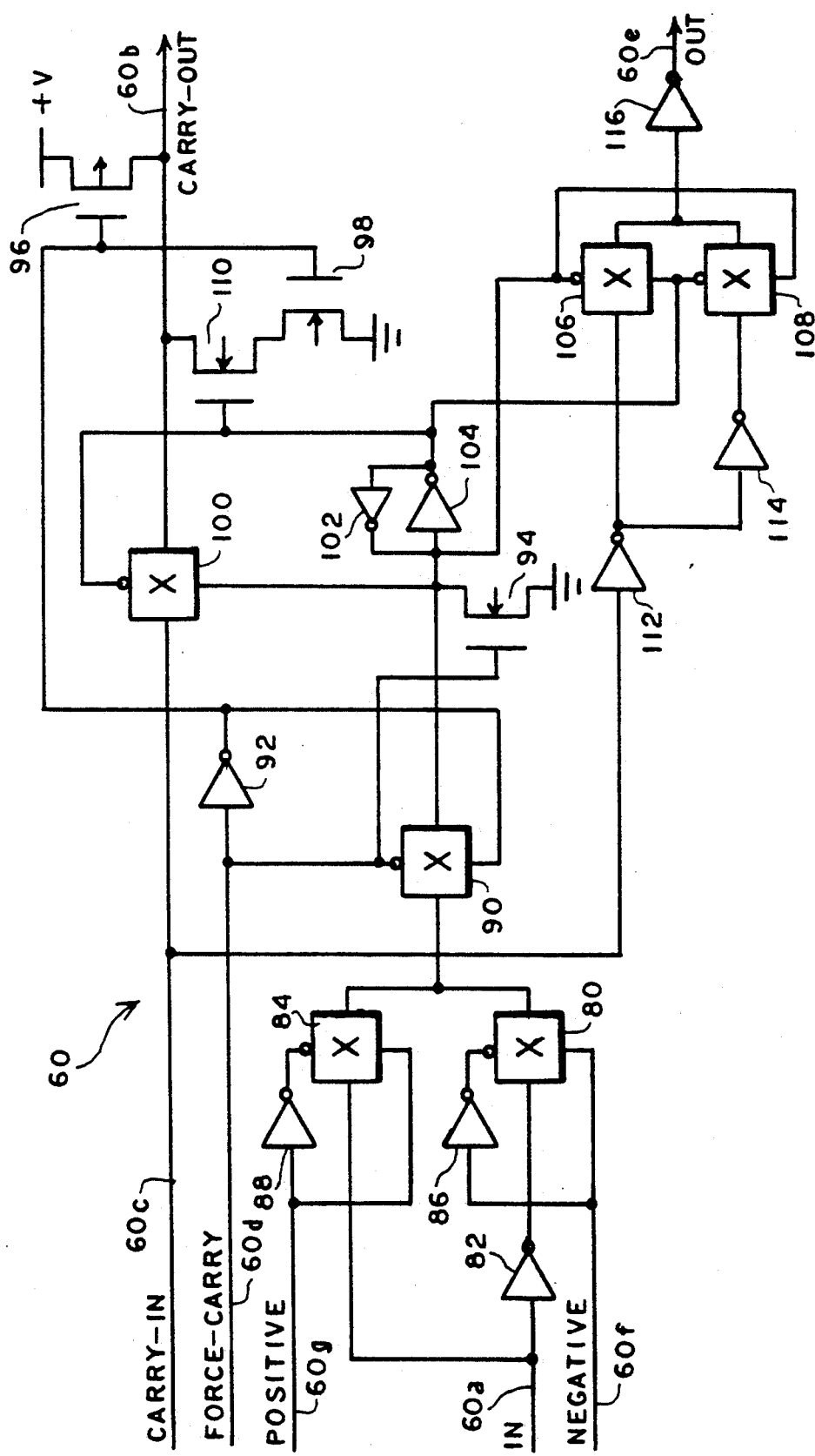
FIG. 3 is a detailed schematic circuit diagram representing the circuitry of each of the half adder cells illustrated in FIG. 2 and embodying the present invention.

Referring now to FIG. 3, it illustrates, in schematic circuit diagram form, the circuit of each of the half adder cells 60–74 of the converting means 20. Since all of the half adder cells are preferably identical, the half adder cell of FIG. 3 will be referred to as the half adder cell 60 illustrated in FIG. 2.

The input 60a of half adder cell 60 is coupled to transfer gate 80 through an inverter 82 and is also coupled directly to another transfer gate 84. The negative input 60f is coupled by an inverter 86 to the inverting input of transfer gate 80 and directly to the noninverting input of transfer gate 80. The positive input 60g is coupled through an inverter 88 to the inverting input of transfer gate 84 and directly to the noninverting input of transfer gate 84. The outputs of transfer gates 80 and 84 are coupled together and to an input of transfer gate 90. The force carry input 60d is coupled directly to the inverting input of transfer gate 90 and to the gate of an n-channel field effect transistor 94. The force carry input 60d is also coupled through an inverter 92 to the noninverting input of transfer gate 90, to the gate of p-channel field effect transistor 96 and to the gate of n-channel field effect transistor 98.

The output of transfer gate 90 is coupled to the noninverting input of transfer gate 100, to the drain of n-channel field effect transistor 94, the output of inverter 102, and the input of inverter 104. The source of n-channel field effect transistor 94 is coupled to ground and the output of transfer gate 100 is coupled to the carry output 60b.

The common junction of the input of inverter 102 and the output 104 is coupled to the inverting input of transfer gate 100, the gate of n-channel field effect transistor 110, the noninverting input of transfer gate 106, and the inverting input of transfer gate 108. The output of transfer gate 90 is also coupled to the inverting input of transfer gate 106 and the noninverting input of transfer gate 108.

The drain of n-channel field effect transistor 110 is coupled to the source of n-channel field effect transistor 98. The carry input 60c is also coupled to the input of transfer gate 106 through inverter 112 and to the input of transfer gate 108 through inverter 112 and another inverter 114. The outputs of transfer gates 106 and 108 are coupled together and to the output 60e through an inverter 116. Lastly, the source of p-channel field effect transistor 96 is coupled to a positive voltage source and the drain is coupled to the carry output 60b. The drain of transistor 98 is coupled to ground.

The operation of the half adder cell 60 will now be summarized. If the positive input 60g is an active high, the output 60e will assume the level of the input 60a. This is to pass a positive signed magnitude binary number through the converting means 20 without conversion to two's complement. If the negative input 60f is an active high, calling for two's complement conversion, as with known half adder cells, if the input is low, the carry input is low, the output will be high and the carry output will be low. If the input is low and the carry input is high, the output will be low and the carry output will be high. If the input is high and the carry input is high, the output will be high and the carry output will be low. Lastly, if the input is high and the carry input is low, the output will be low and the carry output will be low.

At any time should the force carry input 60d assume an active high level, transfer gate 90 will be turned off, transistor 94 will be turned on to turn off transfer gate 100, transistor 96 will be turned on, and transistor 98 will be turned off. With transistor 96 turned on and transistor 98 turned off, the carry output 60b will be pulled up to a high output through transistor 96.

From the foregoing, it can be appreciated that the present invention provides a new and improved system for converting a signed magnitude multiple-bit number to a multiple-bit two's complement binary number. More specifically, the present invention provides a new and improved system for converting a floating point n-bit signed magnitude binary number to a fixed point two's complement binary number having m-bits wherein m is greater than n. Because the conversion to two's complement is achieved before the scaling in a shifter, fewer half adder cells are required than in the prior art. Thus, as a result, the conversion not only requires less hardware, but in addition, less time to complete the conversion.

While a particular embodiment of the present invention has been shown and described, modifications may be made, and it is therefore intended to cover in the appended claims all such changes and modifications which fall within the true spirit and scope of the invention.

What is claimed is:

1. A system for converting a floating point n-bit signed magnitude binary number to a fixed point m-bit two's complement binary number, wherein m is greater than n, said system comprising:

converting means for converting said n-bit signed magnitude binary number to a corresponding n-bit two's complement binary number, said converting means including an input for receiving said n-bit signed magnitude binary number, an output for providing said corresponding n-bit two's complement binary number, and a plurality of half adder cell means coupled in the order of said n-bit signed magnitude number for providing the next higher order half adder cell means with a carry signal responsive to a received forced carry signal when said n-bit two's complement binary number is to be shifted to the right by more than m minus n bits; and shift means for shifting said n-bit two's complement binary number to the left or right responsive to received shift decode signals, said shift means including an input for receiving said n-bit two's complement binary number and an output for providing said fixed point m-bit two's complement binary number.

2. A system as defined in claim 1 wherein each said half adder cell means includes an input for receiving a respective different one of said bits of said n-bit signed magnitude binary number.

3. A system as defined in claim 2 wherein said half adder cell means further include a carry output for providing said next higher ordered half adder cell means with a carry signal and wherein said half adder cell means further include a force carry input for receiving said force carry signal.

4. A system as defined in claim 3 wherein said shift decode signals include a direction control signal to cause said shift means to shift said n-bit two's complement binary number to the left or right and shift control signals including said force carry signals for causing said shift means to shift said n-bit two's complement binary number a predetermined number of bits.

5. A system as defined in claim 4 wherein said converting means is responsive to sign decode signals for converting said n-bit signed magnitude binary number to said n-bit two's complement binary number.

6. A system as defined in claim 5 wherein said sign decode signals include a positive signal control signal and a negative signal control signal, and wherein said converting means is responsive to said negative signal control signal for converting said n-bit signed magnitude binary number to said n-bit two's complement binary number.

7. A system as defined in claim 6 wherein said shift means further include a sign input for receiving said negative sign control signal and for extending the sign in the higher ordered bits of said final field point m-bit two's complement binary number responsive to a received negative sign control signal.

8. A system for converting a floating point n-bit signed magnitude binary number to a fixed point m-bit two's complement binary number, wherein m is greater than n, for use in a floating point multiplying system including a multiplier for multiplying first and second operand magnitudes to provide said n-bit signed magnitude binary number, a sign decoder for providing sign control signals responsive to the signs of said operands, and a shift decoder for providing shift decode signals including force carry signals responsive to the exponents of said operands, said system comprising:

converting means for converting said signed magnitude n-bit binary number to a corresponding two's complement n-bit binary number, said converting means including a plurality of half adder cell means coupled in series relation in the order of said n-bits of said n-bit signed magnitude binary number and each including a carry output for providing the next higher ordered half adder cell means with a carry signal, each said half adder cell means further including an input for receiving a respective different one of said n-bits of said signed magnitude n-bit binary number and a force carry input for receiving said force carry signals for providing the next higher ordered half adder cell means with said carry signal responsive to receiving a force carry signal when said n-bit two's complement binary number is to be shifted to the right by more than m minus n bits, each said half adder cell means further including an output for providing a respective given one of said bits of said corresponding n-bit two's complement binary number; and shift means coupled to said half adder cell means outputs for receiving said corresponding n-bit two's complement binary number, an output for providing said m-bit fixed point two's complement binary number, and being responsive to said shift decode signals for shifting said corresponding n-bit two's complement binary number a selected number of bits for generating said m-bit fixed point two's complement binary number and responsive to said sign control signals for extending the sign in the higher ordered bits of said m-bit fixed point two's complement binary number.

9. A system as defined in claim 8 wherein said half adder cell means are configured such that one of said half adder cell means receives said force carry signal and provides the next higher ordered cell means with said carry signal when said corresponding n-bit two's complement binary number is to be shifted to the right a number of bits greater than m-n bits.

10. A system as defined in claim 9 wherein said sign control signals include a positive sign control signal and a negative sign control signal, and wherein said converting means is responsive to said negative sign control signal for converting said n-bit signed magnitude binary number to said corresponding two's complement binary number.

11. A system as defined in claim 10 wherein said shift decode signals include a direction control signal for causing said shift means to shift said corresponding n-bit two's complement binary number to the left or right and shift control signals including said force carry signals for causing said shift means to shift said corresponding n-bit two's complement binary number said selected number of bits.

12. A system as defined in claim 11 wherein said shift means is responsive to said negative sign control signals for extending the sign in the higher ordered bits of said floating point m-bit two's complement binary number.

* * * * *